United States Patent [19]
Kluck

[11] Patent Number: 5,327,019
[45] Date of Patent: Jul. 5, 1994

[54] DOUBLE EDGE SINGLE DATA FLIP-FLOP CIRCUITRY

[75] Inventor: Wallace A. Kluck, Richardson, Tex.

[73] Assignee: Alcatel Network Systems, Inc., Richardson, Tex.

[21] Appl. No.: 922,271

[22] Filed: Jul. 30, 1992

[51] Int. Cl.$^5$ ............... H03K 3/284; H03K 3/289; H03K 3/29; H03K 19/21

[52] U.S. Cl. ............... 307/272.1; 307/272.2; 307/289; 307/290; 307/471

[58] Field of Search ........... 307/272.1, 272.2, 290, 307/291, 269, 471, 289

[56] References Cited

U.S. PATENT DOCUMENTS

| | | | |
|---|---|---|---|
| 4,695,743 | 9/1987 | Des Brisay, Jr. | 307/272.2 |
| 4,855,615 | 8/1989 | Humpleman | 307/272.1 |
| 5,083,049 | 1/1992 | Kagey | 307/272.1 |
| 5,117,132 | 5/1992 | Watson et al. | 307/272.2 |

FOREIGN PATENT DOCUMENTS

| | | | |
|---|---|---|---|
| 0048611 | 11/1986 | European Pat. Off. | 307/272.2 |
| 0048711 | 11/1987 | Japan | 307/272.2 |
| 3117208 | 5/1991 | Japan | 307/272.2 |

*Primary Examiner*—Timothy P. Callahan
*Assistant Examiner*—Trong Phan
*Attorney, Agent, or Firm*—Baker & Botts

[57] ABSTRACT

A method and system that include double-clock and double-edge flip-flops that produce a circuit output signal in response to two clock signals that have a first flip-flop that produces a first output signal responsive to a first clock signal and a second flip-flop that produces the second output signal responsive to a second clock signal. The method and system provide a means for producing the circuit output signal in response to exclusively either the first flip-flop producing the first output signal or the second flip-flop producing the second output signal. Applications for the method and system include a double-clock single-data flip-flop circuit, a double-edge, double-data flip-flop circuit, a double-edge, single-data flip-flop circuit and a double-edge J-K flip-flop circuit.

10 Claims, 3 Drawing Sheets

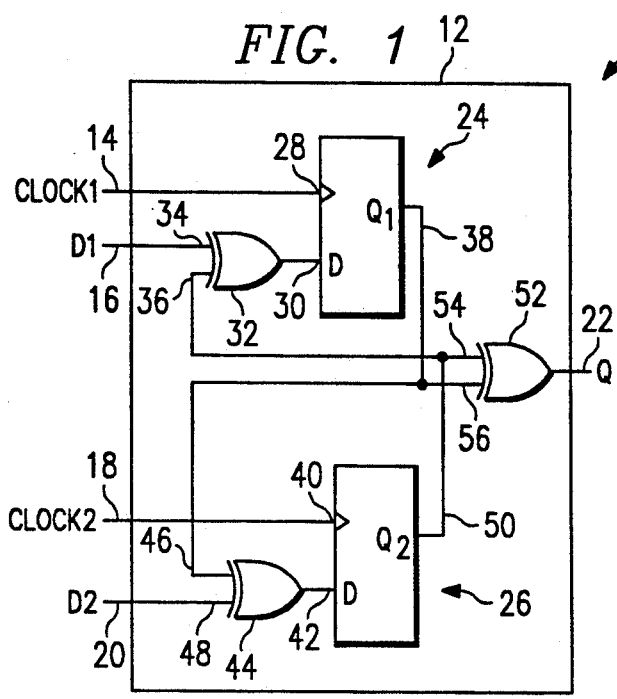

DOUBLE EDGE SINGLE DATA FLIP-FLOP CIRCUITRY

TECHNICAL FIELD OF THE INVENTION

The present invention relates generally to electronics and more particularly to electronic circuitry. Even more specifically, the invention relates to flip-flop circuitry that responds to either two separate clock inputs or both a rising and falling edge of a single clock input and that has a variety of applications.

BACKGROUND OF THE INVENTION

Digital electronic circuits that operate as edge-triggered flip-flops are a widely-used industry-standard building block. Common edge-triggered flip-flops have a single clock input which is sensitive to a single polarity of level transition, either low-to-high or high-to-low, with specific polarity for the device designed-in at the time of manufacture. The typical edge-triggered flip-flop design also has a small number (usually one or two) of synchronous control inputs which are sampled by the device on each occurrence of the predetermined sensitive edge of the clock input. The output or outputs of the edge-triggered flip-flop then are switched by the device to new values according to the sampled input or inputs. For example, the simplest variety of edge-triggered flip-flop is the common type-D flip-flop, which has a single synchronous control input, referred to as the D or data input, and an output, referred to as the Q output, which follows simply the data input logic level at each sensitive edge of the clock. A second output, referred to as the not-Q, Q-false, or Q-bar output, may be provided, which is the logical inverse of the Q output.

Using conventional circuitry, it is difficult to increase the rate of signal output for a given clock signal. This makes the design of circuits for certain outputs impractical, if not impossible. For example, using conventional counter technology, it is very difficult to produce counters that with an even duty cycle, divide by an odd number or that divide-by-(n/2), where n is an odd integer. As a result, there is a need to design a simple circuit that can address these limitations for digital electronic circuits.

It is an object of the present invention, therefore, to provide a simple, easy-to-implement circuit that makes simple the use of double-clock inputs or use of both the rising and falling edge of a single clock input. As such, the present invention solves the limitations in existing digital electronic circuit designs by providing a double-clock flip-flop circuit that produces a circuit output signal in response to two clock signals by using a first flip-flop for producing a first output signal in response to a first clock signal and a second flip-flop for producing a second output signal in response to a second clock signal, then a means for generating an input data signal to the first flip-flop in response to the second output signal combined with a means for producing the circuit output signal in response to exclusively either the first flip-flop producing the first output signal or the second flip-flop producing the second output signal. As a result, the circuit is responsive to two clock input signals.

It is also an object of the present invention to provide a synchronous logic circuit that is sensitive to both edges of a clock signal and that may be used as either a D or J-K flip-flop circuit.

Further, it is an object of the present invention to reduce system clock rates and increase the speed of a counter circuit by using both edges of a single clock input.

Moreover, it is an object of the present invention to provide a circuit that permits both edges of a clock signal to directly control the circuit output signal.

It is a yet another object of the present invention to provide a circuit that has many possible applications for uses requiring double-edge, single-data flip-flops as well as a double-edge, J-K flip-flop output that may be used in various applications such as in counter circuits, shift registers, and state machines.

BRIEF DESCRIPTION OF THE DRAWINGS

The invention and its modes of use and advantages are best understood by reference to the following description of illustrative embodiments when read in conjunction with the accompanying drawings, wherein:

FIG. 1 provides a basic simplified logic circuit diagram of the preferred embodiment of the present invention;

FIG. 2A and 2B show more detailed variations of the basic logic circuit diagrams of the preferred embodiment of the present invention;

DETAILED DESCRIPTION OF THE INVENTION

Figure 3:
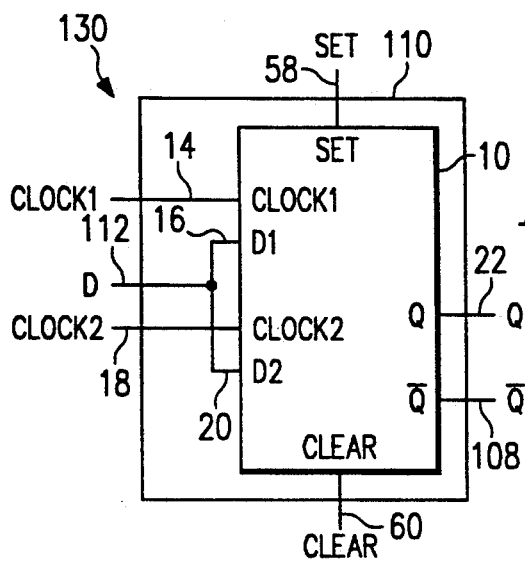
FIG. 3 provides an abbreviated logic circuit diagram for a double-clock, single-data, flip-flop circuit application of the preferred embodiment.

The preferred embodiment of the present invention is best understood by referring to the FIGUREs, wherein like numerals are used for like and corresponding parts of the various drawings.

The basic construction of the present invention may be achieved from readily available components (i.e., two standard D flip-flops and certain digital circuit gate elements). Several variations of circuits that include the preferred embodiment are (1) a double-clock, single-data flip-flop circuit; (2) a double-edge, double-data flip-flop circuit, (3) a double-edge, single-data flip-flop circuit, and (4) a double-edge J-K flip-flop circuit.

The invention has, in concept, a functional block containing two standard type D flip-flop devices. The functional block has a Q output generated by an exclusive-OR or "XOR" gate that combines the Q signals of the two component flip-flops. The clock inputs of the flip-flop devices are directly connected to the two clock inputs of the functional block. Each clock input is associated with a D or data signal. The data signals are inputs to the functional block. Each one of the D signals is fed into an associated flip-flop through an XOR gate whose other input is the Q output of the opposite component flip-flop. Simple additions provide clear, preset, and $\overline{Q}$ (i.e., "not-Q") functions. External additions to the functional block may include gates and jumpers to the basic circuit for the above stated variations (1) through (4) and other types of circuits. For use in substitution of standard type D and J-K flip-flops, the present invention makes the synchronous logic circuit sensitive to both edges of a clock. This allows system clock rates to be cut and/or performance to increase. As such, the present invention has many uses including functions in counter circuits, shift registers and state machines, for example.

Having described the invention generally, reference is now made to FIG. 1 which provides a simplified logic circuit diagram of the preferred embodiment. Double-clock flip-flop circuit 10 is contained within boundary 12 which may denote a single chip or may be multiple chips or even a single subsection within a plurality of devices on a single chip. Furthermore, the implementation of the present invention need not be a chip or sets of chips. In fact, any device capable of achieving the logic functions of the preferred embodiment may be used for the purposes of the present invention.

Leading into circuit 10 are CLOCK1 input 14, D1 data input 16, CLOCK2 input 18, and D2 data input 20. Circuit 10 outputs a Q signal at output 22. A possible alternative to a Q signal at output 22 may be to invert the Q output to produce a $\overline{Q}$ signal at output 22.

At FLIP-FLOP1 24, CLOCK1 signal 14 goes to clock connection 28. D data input 30 receives output from XOR gate 32 which receives both the D1 data input signal 16 at connection 34 and the $Q_2$ output from FLIP-FLOP2 26 at connection 36. Output from the simplified FLIP-FLOP1 24 is $Q_1$ output 38. Referring to FLIP-FLOP2 26 of FIG. 1, CLOCK2 input 18 connects to CLOCK connection 40. FLIP-FLOP2 D input 42 receives from XOR gate 44 output that is exclusively OR data at input 46 from $Q_1$ output 38 of FLIP-FLOP1 24, and at input 48 from D2 data input 20. FLIP-FLOP2 26 provides $Q_2$ output 50. The Q output 22 of double-clock circuit 10 comes from XOR gate 52. XOR gate 52 exclusively-ORs input 54 from $Q_2$ output 50 and input 56 from $Q_1$ output 38.

XOR gates 32 and 44 provide an essential operating characteristic of the preferred embodiment. For example, suppose that D1 data input 16 provides a positive or high value through input 34 to XOR gate 32. Only if output $Q_2$ 50 provides a negative or low value at input 36 will XOR gate 32 provide a high value to input 30 of FLIP-FLOP1 24. Similarly, if D1 data input 16 provides a negative or low value at input 34 to XOR gate 32, only if output $Q_2$ 50 provides a positive or high value to input 36 will XOR gate 32 provide a high value input at 30 to FLIP-FLOP1 24. For the other values of D1 data input 16 and $Q_2$ output 50, D input 30 will be negative or low. Likewise, D input 42 of FLIP-FLOP2 26 will only be positive or high if either D2 input 20 sends a positive or high signal to input 48 of XOR gate 44 and $Q_1$ output 38 provides a negative or low input at 46 to XOR gate 44 or vice versa.

FLIP-FLOP1 24 and FLIP-FLOP2 26 are standard D FLIP-FLOPs. As a result, when FLIP-FLOP1 24 outputs a negative or low output $Q_1$ at 38, FLIP-FLOP2 26 will output a positive or high value at 50 if D2 data input 20 is positive or high at the time of the next clock. Similarly, when FLIP-FLOP2 26 outputs a negative or low value at $Q_2$ output 50, FLIP-FLOP1 24 will output a positive or high value if D1 data input 16 is positive or high. XOR gate 52 outputs a positive or high value when one input is positive or high and the other is negative or low.

An essential characteristic of the present invention is the ability of exclusive OR gates 32, 44 and 52 to put CLOCK1 input 14 and CLOCK2 input 18 in essentially direct control of Q output 22. This is because exclusive OR gate 32 and exclusive OR gate 44 control FLIP-FLOP1 24 and FLIP-FLOP2 26, while exclusive OR gate 52 provides a Q output signal essentially directly in response to CLOCK1 input 14 and CLOCK2 input 18.

An important consideration in the design of double-clock circuit 10 is that the clock edges for CLOCK1 input 14 and CLOCK2 input 18 not be too close together in time. The edges for these two clock signals should be sufficiently separated in time to prevent an undefined state from occurring in the operation of double-clock circuit 10. If the clock edges are too close together in time, FLIP-FLOP1 24 and FLIP-FLOP2 26 will attempt to get Q output 22 to a specific state based on an assumption that, due to the short time span between the clock edges, will no longer be true. That is, for the instant in which it operates, circuit 10 assumes that the output of the other clock has not changed. FLIP-FLOP1 24 uses the output of FLIP-FLOP2 26 to determine the FLIP-FLOP1 24 output. If the two clock signals are too close together, there will not be sufficient time for FLIP-FLOP1 24 and FLIP-FLOP2 26 to derive its necessary output.

Having described the invention with a simplified block diagram, reference is now made to FIG. 2A which provides a more detailed logic circuit diagram of the preferred embodiment and includes further features. Again, double-clock, flip-flop circuit 100 is contained within boundary 12 which may denote a single chip or may be multiple chips or even a single subsection within a plurality of devices on a single chip. Leading into circuit 100 is SET (or PRESET) input 58, CLOCK1 input 14, D1 data input 16, CLOCK2 input 18, D2 data input 20, and CLEAR (or RESET) input signal 60. Outputs from circuit 100 include Q output 22 and $\overline{Q}$ outputs 62 and 64. Although FIG. 1 does not show $\overline{Q}$ outputs 62 and 69, they are inherent in the design of circuit 10 of FIG. 1 and should be considered part thereof. Within boundary 12, SET input 58 goes to FLIP-FLOP1 24 at lead 66 and FLIP-FLOP2 26 via connection 68 to OR gate 70 that connects to CLEAR signal connection 72. OR gate 70 also receives at CLEAR input 74 a CLEAR signal from the circuit CLEAR input 60. Returning to FLIP-FLOP 24, CLOCK1 signal 14 goes to connection 28. D data input 30 receives output from XOR gate 32 which receives both the D1 data input signal 16 at connection 34 and the $Q_2$ output from FLIP-FLOP2 26 at connection 36. CLEAR input from circuit CLEAR signal 60 goes to FLIP-FLOP1 24 at connection at 76. Outputs from FLIP-FLOP1 24 include $Q_1$ output 38 and $\overline{Q}_1$ output 78.

Referring to FLIP-FLOP2 26 of FIG. 2A, SET connection 80 is connected to logic zero or ground. CLOCK2 input 18 connects to CLOCK connection 40. FLIP-FLOP2 input 42 receives exclusively-OR'd output from XOR gate 44 which receives an input 46 from $Q_1$ output 38 of FLIP-FLOP1 24 and an input 48 from D2 data input 20. CLEAR input 72 is as previously described. Outputs from FLIP-FLOP2 26 in the more detailed FIG. 2A diagram include $Q_2$ output 50 and $\overline{Q}_2$ output 82.

XOR gates 84 and 86 provide $\overline{Q}$ outputs. Although two apparatus $\overline{Q}$ outputs are shown for completeness of disclosure, in practice only one $\overline{Q}$ output would be provided. XOR gate 84 provides a positive or high $\overline{Q}$ output when $\overline{Q_1}$ output 78 is positive or high and $Q_2$ output 50 is negative or low, or when $\overline{Q_1}$ output 78 is negative or low and $Q_2$ output 50 is positive or high. Conversely, XOR gate 86 provides a positive or high $\overline{Q}$ output when $Q_1$ output 38 is positive or high and $\overline{Q_2}$ output 82 is negative or low, or when $Q_1$ output 38 is negative or low and $\overline{Q_2}$ output 82 is positive or high. Thus, outputs Q 22, $\overline{Q}$ 62, and $\overline{Q}$ 64 of double-clock circuit 100 come, respectively, from XOR gates 52, 84 and 86. XOR gate 52 exclusively-ORs input 54 from $Q_2$ output 50 and input 56 from $\overline{Q_1}$ output 38. XOR gate 84 exclusively-ORs input 88 from $\overline{Q_1}$ output 78 and input 90 from $Q_2$ output 50. Finally, XOR gate 86 exclusively-ORs input 92 from $Q_1$ output 38 and input 94 from $\overline{Q_2}$ output 82.

SET (or PRESET) input 58 and CLEAR input 60 establish the initial conditions for FLIP-FLOP1 24 and FLIP-FLOP2 26. Double-clock, flip-flop circuit 100 could be set to zero output in either of two possible ways. These include clearing both FLIP-FLOP1 24 and FLIP-FLOP2 26 or setting them both to 1. In the preferred embodiment, a SET or CLEAR signal will clear FLIP-FLOP2 26, whereas a SET input 58 will set FLIP-FLOP1. A CLEAR input at input 60 will go to CLEAR input 76 to clear FLIP-FLOP1 24. Thus, SET input 58 going to SET connection 68 at OR gate 70 provides a CLEAR signal to FLIP-FLOP2 26, and FLIP-FLOP2 26 receives no set signal, because set connection 80 is left as a free connection. This prevents setting both FLIP-FLOP1 24 and FLIP-FLOP2 26 at the same time and forces opposite conditions on the two flip-flops when FLIP-FLOP1 24 receives a SET signal.

Referring briefly to FIG. 2B, there is shown a partial reformulation of the basic circuit of FIG. 2A. Note that the alternative embodiment in FIG. 2B uses only XOR gate 52, instead of having three output XOR gates. Additionally, neither $\overline{Q_1}$ nor $\overline{Q_2}$ outputs comes from the circuit. Instead, XOR gate 52 provides an input 102 to inverter 104 from which comes $\overline{Q}$ output 106. An advantage of the alternative embodiment of FIG. 2B is a simpler design that eliminates XOR gate 84 and 86 that appear in the preferred embodiment of FIG. 2A. A disadvantage of the alternative embodiment of FIG. 2B may be the additional gate delay arising from the signal from XOR gate 52 passing through inverter 104 to produce the $\overline{Q}$ output 106. Depending on the particular application, there may be instances in which the basic circuit of FIG. 2B is preferable to that of FIG. 2A.

FLIP-FLOP1 24 and FLIP-FLOP2 26 are standard, edge-triggered flip-flops, which for discussion purposes may be assumed to be sensitive to the positive edges of their respective clock input signals, although negative edge-triggered flip-flops could also be used, or even one flip-flop of each type could suit a particular application. Circuit 10 of the preferred embodiment is designed to perform a similar function to a standard, edge-triggered flip-flop except for having two sets of associated clock and data inputs. Circuit input CLOCK1 14 and circuit input D1 16 comprise the first associated set, while circuit Input CLOCK2 18 and circuit input D2 20 comprise the second associated set. Circuit output Q 22 is generated by exclusive-OR gate 52, which has its input 56 and input 54 driven by output $Q_1$ 38 and output $Q_2$ 50, respectively.

The preferred embodiment uses a unique characteristic of the exclusive-OR function. The preferred embodiment uses the exclusive-OR function, implemented in hardware as an exclusive-OR gate. This gate outputs a 0 when both inputs are logic 0 or logic 1, but outputs a 1 when there is one 0 and one 1 on the inputs. In other words, the output indicates whether the two inputs show a match or mismatch. The standard "truth table" for the exclusive OR function is as follows:

TABLE 1

| EXCLUSIVE "OR" TRUTH TABLE | | |
|---|---|---|
| Input 1 | Input 2 | Output |
| 0 | 0 | 0 |
| 0 | 1 | 1 |
| 1 | 0 | 1 |
| 1 | 1 | 0 |

Inputs 1 and 2 are independent variables that may be thought of, for example, as inputs 34 and 36 to XOR gate 32; in this case, the Output column represents input 30 to FLIP-FLOP1 24. Close inspection of Table 1 reveals that the output is an indication of whether or not the two inputs are identically matched. As a result, Q 22 output, being so generated from the logic states of FLIP-FLOP1 24 and FLIP-FLOP2 26, is under equal and complete control of each of FLIP-FLOP1 24 and FLIP-FLOP2 26. In other words, a match or mismatch can be forced through control of the associated flip-flop, as long as the other flip-flop remains in a constant state. CLOCK1 input 16 and CLOCK2 input 20 feed the clock inputs 28 and 40 of FLIP-FLOP1 24 and FLIP-FLOP2 26, respectively.

For proper operation, to prevent an undefined state on circuit Q 22 output, these are expected to not have their active transitions at the same time or too close in time for internal signal propagation to occur. As long as this condition is met, the circuit will, on each active clock transition of CLOCK1 input 14 or CLOCK2 input 18, transfer to Q 22 output the current state of D1 input 16 or D2 input 20, respectively. This is guaranteed by feeding D input 30 and D input 42 of the two flip-flops with appropriately calculated signals, which are generated by exclusive-OR gate 32 and exclusive-OR gate 44, respectively. The effect of these gates can be best explained with reference to the above exclusive-OR truth Table 1. Inspection will reveal that for cases where Input 1 is a logic 0, Input 2 is passed unchanged to the gate output, but for cases where Input 1 is a logic 1, Input 2 is passed in an inverted state to the gate output. In other words, Input 1 tells the gate to make the output either the same or different from input 2. (This is also true if the input names are reversed; i.e., exclusive-OR is a commutative function.)

Using this fact to good advantage, each of exclusive-OR gates 32 and 44 is fed with its associated D1 input 16 or D2 input 20, respectively. The remaining input of each of exclusive-OR gates 32 and 44 is fed with $Q_2$ output 50 or $Q_1$ output 38 of the opposite flip-flop. Thus, the D input of each flip-flop is continuously fed with a value either identical or opposite, depending on the associated circuit D input, to the other flip-flop's current Q output. This is exactly the value needed to get the desired value on Q 22 output when the clock transition occurs. A positive high value on D1 input 16 or D2 input 20 conditions the associated flip-flop to take the inverse value of the opposite flip-flop on the associated clock's active transition, forcing a positive or high value on the circuit output, whereas a negative or low value on D1 input 16 or D2 input 20 conditions the associated flip-flop to take the identical value of the opposite flip-flop on the associated clock's active transition, forcing a negative or low value on the circuit output.

FLIP-FLOP1 24 and FLIP-FLOP2 26 have their outputs combined by exclusive-OR gate 52 to produce the main circuit output 22. This gives total control of the circuit 10 output to whichever of FLIP-FLOP1 24 or FLIP-FLOP2 26 receives an active clock edge, as long as the other flip-flop is not clocked at the same time. The data inputs of circuit 10, which are associated with each of the clock inputs, carry a value which is being requested for transfer to circuit output 22 on the next active transition of the associated clock.

FIGS. 3 through 6 show various applications of the preferred embodiment. In order to focus on the applications, in each of these figures the basic circuit 10 of FIG. 1 is shown in an abbreviated form simply as a flip-flop circuit having two clock inputs and two data inputs without further detail of the internal structure of the circuit (that having already been provided above). Additionally, alternative $\overline{Q}$ outputs 62 and 64 that appear in FIG. 2A are represented simply as $\overline{Q}$ output 108 to represent a single $\overline{Q}$ output. The two $\overline{Q}$ outputs 62 and 64 of FIG. 2A were illustrated for the purpose of showing that there are two equally effective ways to produce a $\overline{Q}$ output from the basic circuit 10 of the preferred embodiment.

Referring more particularly to FIG. 3, double-clock flip-flop circuit 10 is shown within boundary 110 which may be a single chip or may be a single section within a chip. SET input 58, CLOCK1 input 14, CLOCK2 input 18, and CLEAR input 60 operate essentially as described above. In the double-clock, single-data input application of FIG. 3, D data input 112 provides a single data input to D1 data input 16 and D2 data input 20.

Figure 4:
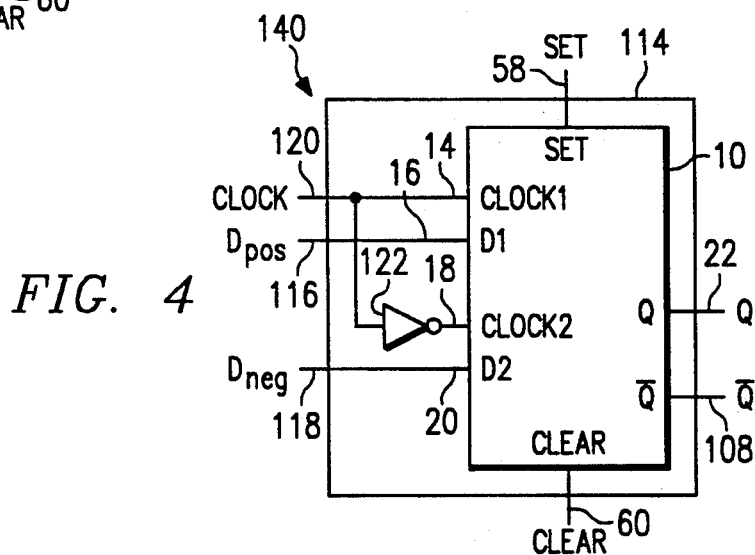
FIG. 4 illustrates an abbreviated logic circuit diagram for a double-edge, double-data, flip-flop circuit application of the preferred embodiment.

In FIG. 4 appears a double-edge, double-clock application 140 of the preferred embodiment. In the double-edge application, double-clock, flip-flop circuit 10 may sit within boundary 114 to provide Q output 22 and $\overline{Q}$ output 108. SET signal 58 and CLEAR signal 60 operate as previously described. D1 data input 16 comes from $D_{pos}$ data signal 116 and D2 data input 20 is $D_{neg}$ input 118. CLOCK1 input 14 and CLOCK2 input 18 are sensitive to the rising edge and falling edge, respectively, of CLOCK input 120. CLOCK2 input 18 receives an inverted clock signal due to inverter 122. Note, however, that it may be desirable to construct basic double-clock circuit 10 so that FLIP-FLOP2 26, instead of responding to the rising edge of a clock signal, triggers on a falling edge of a clock signal. In such case, inverter 122 would not be necessary and this may avoid some propagation delays.

Figure 5:
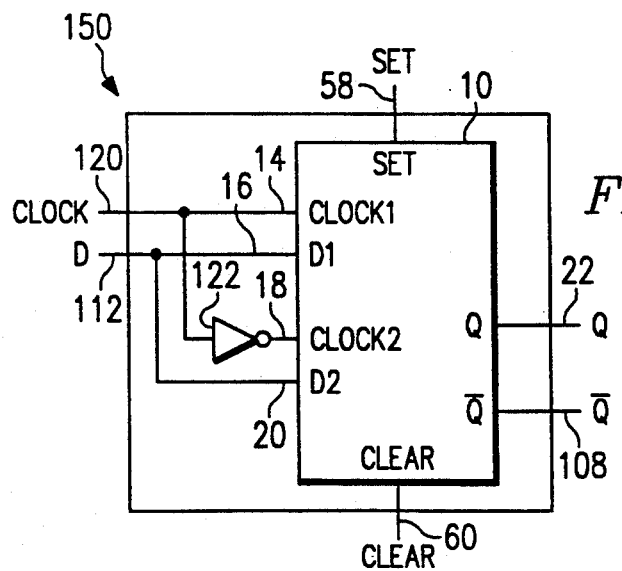
FIG. 5 provides an abbreviated logic circuit diagram for a double-edge, single-data, flip-flop circuit application of the preferred embodiment.

In FIG. 5, double-edge, single-data application 150 attempts to combine the beneficial results of the double-clock, single-data application 130 of FIG. 3 and the double-edge, double-data application 140 of FIG. 4. Again, both the rising edge and falling edge of clock signal 120 operate to drive the Q output 22 of the basic circuit 10. Also, D data input 112 provides D1 data input 16 and D2 data input 20. A particularly attractive aspect of double-edge, single-data application 150 is that it has the same number of pins and essentially the same function as the standard type D flip-flop circuit. As a result, it can be easily substituted for a standard D flip-flop in many cases. Application 150, as opposed to the standard type D flip-flop, is sensitive to both edges of clock signal 120. Therefore, for example, it is practical to design a shift register that operates on both edges of the clock. A large number of different kinds of synchronous counters including some counters that operate as pseudo-random counters and gray code counters may use the circuit design of double-edge, single-data application 150.

Figure 6:
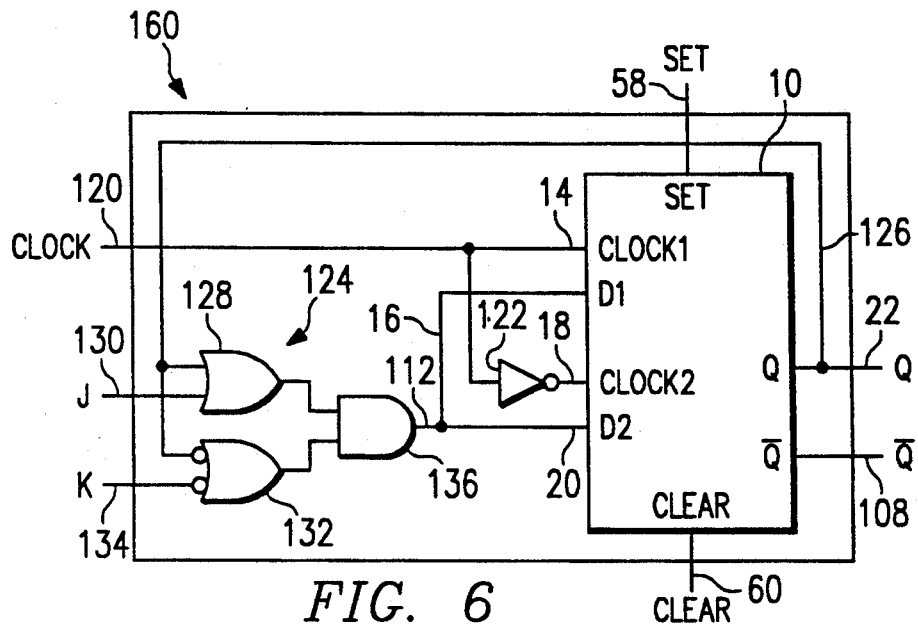
FIG. 6 provides an abbreviated logic circuit diagram for a double-edge, J-K flip-flop application of the preferred embodiment.

In FIG. 6, double-edge J-K flip-flop application 160 includes essentially the double-edge, single-data application 150, but additionally provides a J-K logic circuit transformation. As with double-edge applications 140 and 150, double-edge J-K flip-flop application 160 provides a single CLOCK input 120 that provides a rising edge input as CLOCK input 14 and an input to inverter 122 which causes the falling edge to be a rising edge input for CLOCK2 input 18 to basic circuit 10. Similarly, D data input 112 provides a common single-data signal for D1 data input 16 and D2 data input 20 of basic circuit 10. SET input 58 and CLEAR input 60 operate as previously described. Q output 22 and $\overline{Q}$ output 108 are as described, with the exception that the Q output from basic circuit 10 goes via line 126 to J-K flip-flop transformation circuitry 124.

J-K flip-flop transformation circuitry 124 includes OR gate 128 that receives Q output 22 from basic circuitry 10 and J input 130. NAND gate 132 operates to OR the negated Q output 22 from line 126 with the negated K input signal 134. From OR gate 128 and NAND gate 132, outputs go to AND gate 136 to generate the data input signal 112 which functions as previously described.

When application 150 or 160 is used in place of common D and J-K flip-flops in a synchronous counter with an odd number of counting states, non-integer divide ratios may be achieved. For example, a divide-by-7 counter becomes a divide-by-3.5 counter. When used in place of common D and J-K flip-flops in a synchronous counter with any integer number of counting states, new output waveforms and duty cycles become possible. For example, a divide-by-6 counter with a repeating output pulse one clock cycle in duration becomes a divide-by-3 counter with a repeating output pulse one-half clock cycle in duration.

As with double-edge, single-data application 150, double-edge J-K flip-flop application 160 may be inserted into many synchronous logic circuits with no necessary change to the surrounding circuitry. A benefit to this configuration is that application 160, when inserted will be sensitive to both the rising and falling edge of CLOCK signal 120. Another particularly attractive feature of both D flip-flop application 150 and J-K flip-flop application 160 is that these circuits make it easier and more intuitive to produce a divide-by-(n/2) counter where n is an odd integer than is possible with conventional designs. This is not the case in conventional D flip-flop or J-K flip-flop circuitry that use either synchronous or ripple counter design concepts.

Figure 7:
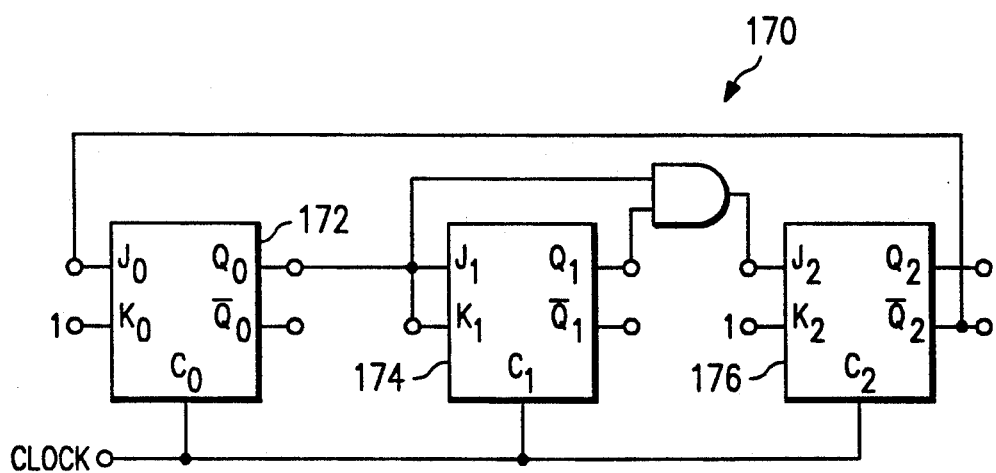
FIG. 7 shows an exemplary divide-by-n circuit (where n is odd number, in this case n=5) that the preferred embodiment can transform into a divide-by-(n/2) circuit application.

In FIG. 7, appears a conventional divide-by-5 counter 170. By replacing J-K flip-flops 172, 174, and 176 with the J-K flip-flop circuit application 160 of FIG. 6, the preferred embodiment easily converts the divide-by-5 counter to a divide-by-(5/2) counter.

OPERATION

The operation as a whole of the preferred embodiment may be best understood by returning to FIG. 2A, which shows the double-clock, double-data simplified circuit 100. Within boundary 12, FLIP-FLOP2 26 may be cleared and FLIP-FLOP1 24 may either be set upon receiving the SET signal or cleared upon the CLEAR signal. Two clock signals go into circuit 100, one at CLOCK1 input 14 and another at CLOCK2 input 18. Also two data signals go in D1 input 16 and D2 input 20. Assume that a 1 or high level input exists on D1 input 16 and a 0 or low level signal appears at D2 input 20. Also, assume that $Q_2$ output 50 from FLIP-FLOP2 26 is 0 or low and that $Q_1$ output 38 from FLIP-FLOP1 24 is 1 or high. With each CLOCK1 rising edge input, FLIP-FLOP1 24 will receive a rising edge clock signal. Through XOR gate 32, high level input D1 at point 34 is exclusively-OR'd with low level output $Q_2$ 50 to provide a high level input at D input 30 to FLIP-FLOP1 24. As a result, $Q_1$ output 38 will be high and $\overline{Q}_1$ output 78 will be low. The high $Q_1$ output 38 goes to input 56 of XOR gate 52, input 92 of XOR gate 86, and input 46 of XOR gate 44. The low $\overline{Q}_1$ output 78 goes to input 88 of XOR gate 84. Since, as already supposed, FLIP-FLOP2 26 is cleared, $Q_2$ output 50 is low and $\overline{Q}_2$ output 82 is high. The $Q_2$ output 50 goes to input 90 of XOR gate 84, input 54 of XOR gate 52 and input 36 of XOR gate 32. The high $\overline{Q}_2$ output 82 goes to input 94 of XOR gate 86. At this point, the outputs for circuit 100 are, therefore, (1) a low output at $\overline{Q}$ output 62 from XOR gate 84 (2) a high output at Q output 22 from XOR gate 52 and (3) low output at $\overline{Q}$ output 64 from XOR gate 86.

Assume, for example, that the next clock signal for circuit 100 is a CLOCK2 signal at CLOCK2 input 18 to FLIP-FLOP2 26. In response to this signal, the operation of FLIP-FLOP2 26 will be to output a signal reflecting the value at data input 42. The signal value at data input 42 will be the exclusive OR'd output of XOR gate 44. Inputs to XOR gate 44, at this point, are the 1 or high level signal at input 46 from $Q_1$ output 38 and the 0 or low level signal at input 48 from D2 input 20. Consequently, the value at D input 42 is high, causing the $Q_2$ output 50 to change from low to high and $\overline{Q}_2$ output 82 to change from high to low. This causes inputs 90, 54, and 36 to be high and input 94 to be low. As a result, XOR gate 84 compares low input 88 with high input 90 to output a high value at $\overline{Q}$ output 62. XOR gate 52 compares high input 54 with high input 56 to output a low compares high input 54 with high input 56 to output a low value at Q output 22. Also, XOR gate 86 compares high input 92 with low input 94 to provide a high value at $\overline{Q}$ output 64. With regard to the applications of FIGS. 3, 4, 5 and 6, the different input signals vary. The operation of circuit 100 in each application will be essentially the same with each application.

In summary, there is shown a double-clock flip-flop circuit for producing a circuit output signal in response to two clock signals that uses a first flip-flop for producing a first output signal in response to a first clock signal and a second flip-flop signal for producing a second output signal in response to a second clock signal. It further provides a means for generating an input data signal to the first flip-flop in response to the second output signal and a means for generating an input data signal to the second flip-flop in response to the first output signal and a means for producing the circuit output signal in response to exclusively either the first flip-flop producing the first output signal or the second flip-flop producing the second output signal.

Although the invention has been described with reference to the above-specified embodiments, this description is not meant to be construed in a limiting sense. Various modifications of the disclosed embodiment, as well as alternative embodiments of the invention will become apparent to persons skilled in the art upon reference to the above description. For example, the use of NAND gates or exclusive NOR gates may be contemplated in certain instances, instead of exclusive OR gates as in the preferred embodiment. It is therefore, contemplated that the appended claims will cover such modifications that fall within the true scope of the invention.

What is claimed is:

1. A double-clock, flip-flop circuit for producing a circuit output signal in response to two clock input signals, comprising:
   a first flip-flop for producing a first output signal in response to a first clock signal;
   a second flip-flop for producing a second output signal in response to a second clock signal;
   means for generating an input data signal to said first flip-flop in response to said second output signal; and
   means for generating said circuit output signal in response to exclusively either said first flip-flop producing said first output signal or said second flip-flop producing said second output signal.

2. A double-data, flip-flop circuit for forcing a desired state on a circuit output signal, comprising:
   a first flip-flop for producing a first output signal in response to a first clock signal and a first data signal;
   a second flip-flop for producing a second output signal in response to a second clock signal and a second data signal;
   said first data signal comprising a signal responsive to said second output signal and a first data input, and said second data signal comprising a signal responsive to said first output signal and a second data input, said second clock signal comprising the inversion of said first clock signal; and
   means for forcing said circuit output signal to said desired state in response to exclusively either said first flip-flop producing said first output signal or said second flip-flop producing said second output signal.

3. A double-clock, single-data flip-flop circuit for producing a circuit output signal in response to two clock input signals and a single-data signal, comprising:
   a first flip-flop for producing a first output signal in response to a first clock signal and a first data signal;
   a second flip-flop for producing a second output signal in response to a second clock signal and a second data signal;
   said first data signal comprising a signal responsive to said second output and a data input, and said second data signal comprising a signal responsive to said first output and said data input; and
   means for producing said circuit output signal in response to exclusively either said first flip-flop producing said first output signal or said second flip-flop producing said second output signal.

4. A double-edge, single-data, flip-flop circuit for producing a circuit output signal in response to two clock input signals, comprising:
   a first flip-flop for producing a first output signal in response to a first clock signal and a first data signal;
   a second flip-flop for producing a second output signal in response to a second clock signal and a second data signal;

said first data signal comprising a signal responsive to said second output signal and a first data input associated with said first clock signal, and said second data signal comprising a signal responsive to said first output signal and a second data input associated with said second clock signal; and means for producing said circuit output signal in response to exclusively either said first flip-flop producing said first output signal or said second flip-flop producing said second output signal.

5. A double-edge J-K flip-flop circuit for producing a circuit output signal in response to J and K logic inputs and a clock input signal, comprising:

a first D logic flip-flop for producing a first output signal in response to a first clock signal and a first D logic data signal;

a second D logic flip-flop for producing a second output signal in response to a second clock signal and a second data D logic data signal, said second clock signal comprising an inversion of said first clock signal;

logic conversion means for converting a plurality of J-K logic data signals to said first and second D logic data signals; and means for producing said circuit output signal in response to exclusively either said first flip-flop producing said first output signal or said second flip-flop producing said second output signal.

6. A method for producing a circuit output signal in response to two clock input signals, comprising:

producing a first output signal from a first flip-flop in response to a first clock signal;

producing a second output signal from a second flip-flop in response to a second clock signal;

generating a control input to said first flip-flop in response to said second output signal; and outputting said circuit output signal in response to exclusively either producing said first output signal from said first flip-flop or producing said second output signal from said second flip-flop.

7. A method for producing a circuit output signal in response to both a rising and a falling edge of a clock input signal, comprising:

producing a first output signal from a first flip-flop in response to a rising edge of a clock signal and a first data signal;

producing a second output signal from a second flip-flop in response to a falling edge of said clock signal and a second data signal;

generating a control input to said first flip-flop in response to said second output signal; and outputting said circuit output signal in response to exclusively either said first flip-flop producing said first output signal or said second flip-flop producing said second output signal.

8. A method for forcing a desired state on a circuit output signal using a double-data, flip-flop circuit, comprising the steps of:

producing a first output signal from a first flip-flop in response to a first clock signal and a first data signal, said first data signal associated with said first clock signal;

producing a second output signal from a second flip-flop in response to a second clock signal and a second data signal, said second data signal associated with said second clock signal and said second clock signal comprising the inversion of said first clock signal; and outputting said desired state on said circuit output signal in response to exclusively either said first flip-flop producing said first output signal or said second flip-flop producing said second output signal.

9. A method for producing a double-clock, single-data circuit output signal from a flip-flop circuit in response to two clock input signals, comprising the steps of:

producing a first output signal from a first flip-flop in response to a first clock signal and a first data signal;

producing a second output signal from a second flip-flop in response to a second clock signal and said first data signal;

generating a control signal to control said first data signal in response to said second output signal; and outputting said circuit output signal in response to exclusively either said first flip-flop producing said first output signal or said second flip-flop producing said second output signal.

10. A method for producing a double-edge, J-K logic output circuit signal, comprising the steps of:

converting J-K logic data signals into a plurality of D logic data signals;

producing a first output signal from a first flip-flop in response to a first clock signal and one of said plurality of D logic data signals;

producing a second output signal from a second flip-flop in response to a second clock signal and another of said plurality of D logic data signals, said second clock signal comprising an inversion of said first clock signal;

outputting said circuit output signal in response to exclusively either said first flip-flop producing said first output signal or said second flip-flop producing said second output signal.

* * * * *